(12) United States Patent
Jeong

(10) Patent No.: US 11,832,487 B2
(45) Date of Patent: Nov. 28, 2023

(54) DISPLAY DEVICE

(71) Applicant: SAMSUNG DISPLAY CO., LTD., Yongin-si (KR)

(72) Inventor: Young-Cheol Jeong, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/051,334

(22) Filed: Oct. 31, 2022

(65) Prior Publication Data

US 2023/0080228 A1 Mar. 16, 2023

Related U.S. Application Data

(62) Division of application No. 16/730,248, filed on Dec. 30, 2019, now Pat. No. 11,522,032.

(30) Foreign Application Priority Data

Dec. 31, 2018 (KR) .................. 10-2018-0173828

(51) Int. Cl.
*H10K 59/131* (2023.01)
*H05K 1/14* (2006.01)
*H05K 1/11* (2006.01)

(52) U.S. Cl.
CPC .......... *H10K 59/131* (2023.02); *H05K 1/117* (2013.01); *H05K 1/147* (2013.01); *H05K 2201/056* (2013.01); *H05K 2201/10128* (2013.01)

(58) Field of Classification Search
CPC . H01L 27/3276; H01L 23/4985; H01L 24/86; H01L 23/498; H01L 24/50;
(Continued)

(56) References Cited

U.S. PATENT DOCUMENTS 9,329,447 B2 5/2016 Jung et al.
9,933,664 B2 4/2018 Kim et al.
(Continued)

FOREIGN PATENT DOCUMENTS

CN 1825615 8/2006
CN 105977396 9/2016
(Continued)

OTHER PUBLICATIONS

Office Action dated Nov. 23, 2022 in corresponding Chinese Patent Application Serial No. 201911357419.1 (6 pages), in Chinese.

*Primary Examiner* — Mouloucoulaye Inoussa
(74) *Attorney, Agent, or Firm* — F. CHAU & ASSOCIATES, LLC

(57) ABSTRACT

A display device according to an exemplary embodiment of the present invention includes: a first substrate and a second substrate; a plurality of signal lines that are formed on the first substrate or on the second substrate; and a plurality of side wires that are disposed in a side surface of a first edge of the first substrate and a side surface of a second edge of the second substrate, wherein the plurality of side wires are disposed apart from each other along a direction in which the first edge extends, and are connected with the plurality of signal lines, and a first thickness of side wires disposed at an end of the first edge and at and end of the second edge is different from a second thickness of the side wire disposed at inside of the edges of the first edge and the second edge.

3 Claims, 16 Drawing Sheets

(58) Field of Classification Search
CPC ......... H01L 23/49805; H01L 23/49883; H01L 24/27; H01L 24/31; H01L 23/49861; H01L 51/0096; H01L 24/29; H01L 24/32; H01L 24/83; H01L 2224/83801; H01L 2224/29082; H01L 2224/8388; H01L 2224/29078; H01L 2224/32227; H01L 2224/29083; H01L 2224/271; H01L 2224/83862; H01L 2224/27552; H01L 2224/83851; H01L 2224/2731; H01L 2224/27312; H01L 2224/83192; H01L 2224/27334; H01L 2924/00014; H01L 2924/00012; H05K 1/118; H05K 1/117; H05K 1/147; H05K 1/189; H05K 3/3463; H05K 3/361; H05K 3/323; H05K 2201/10128; H05K 2201/056; H05K 2201/10136; G02F 1/13458; G02F 1/134309; G02F 1/136286; G02F 1/133345; G02F 1/1345; G02F 1/13452; G02F 1/13336; G02F 1/1339; G02F 1/13398; G02F 1/133308; G02F 1/133314; G02F 1/1368; G02F 2201/50; G02F 2202/28; H01S 5/028; H01S 5/0425; B23K 1/0008; B23K 1/0016; Y02E 10/549; Y02P 70/50

See application file for complete search history.

(56) References Cited

U.S. PATENT DOCUMENTS

| | | | |
|---|---|---|---|
| 9,947,652 | B2 | 4/2018 | Choi et al. |
| 10,090,334 | B2 | 10/2018 | Bae et al. |
| 10,170,462 | B2 | 1/2019 | Choi et al. |
| 10,209,548 | B2 | 2/2019 | Park et al. |
| 10,529,746 | B2 | 1/2020 | Bae et al. |
| 11,183,517 | B2 | 11/2021 | Bae et al. |
| 2005/0238803 | A1 | 10/2005 | Tremel et al. |
| 2006/0139342 | A1 | 6/2006 | Yu |
| 2006/0283546 | A1 | 12/2006 | Tremel et al. |
| 2006/0284556 | A1 | 12/2006 | Tremel et al. |
| 2007/0075626 | A1 | 4/2007 | Yu et al. |
| 2010/0097551 | A1 | 4/2010 | Yamagishi et al. |
| 2011/0069271 | A1 | 3/2011 | Chu et al. |
| 2011/0115364 | A1 | 5/2011 | Kim |
| 2014/0092034 | A1 | 4/2014 | Franklin et al. |
| 2014/0176863 | A1 | 6/2014 | Oohira |
| 2015/0189768 | A1* | 7/2015 | Kishida .................. H05K 1/028 361/749 |
| 2016/0066410 | A1* | 3/2016 | Cho ........................ H05K 1/028 361/749 |
| 2016/0147345 | A1 | 5/2016 | Lee et al. |
| 2017/0005083 | A1 | 1/2017 | Choi et al. |
| 2017/0037121 | A1 | 2/2017 | Schlothauer |
| 2017/0064826 | A1* | 3/2017 | Park ....................... H05K 1/118 |
| 2017/0082888 | A1 | 3/2017 | Park et al. |
| 2017/0082900 | A1 | 3/2017 | Kong et al. |
| 2017/0139249 | A1* | 5/2017 | Moon .................. H10K 77/111 |
| 2017/0357121 | A1 | 12/2017 | Cho et al. |
| 2018/0061367 | A1 | 3/2018 | Ye et al. |
| 2018/0067354 | A1 | 3/2018 | Son et al. |
| 2018/0081232 | A1* | 3/2018 | Park ..................... G02F 1/13306 |
| 2018/0088389 | A1 | 3/2018 | Furuta |
| 2018/0173042 | A1 | 6/2018 | Kim et al. |
| 2018/0307084 | A1 | 10/2018 | Lee et al. |
| 2019/0204698 | A1 | 7/2019 | Wang |
| 2019/0369447 | A1 | 12/2019 | Chuang |
| 2020/0212160 | A1 | 7/2020 | Jeong |

FOREIGN PATENT DOCUMENTS

| | | |
|---|---|---|
| CN | 106324927 | 1/2017 |
| CN | 107479229 | 12/2017 |
| CN | 107845331 | 3/2018 |
| KR | 10-2015-0074275 | 7/2015 |
| KR | 10-2017-0139217 | 12/2017 |
| KR | 10-2018-0119728 | 11/2018 |

* cited by examiner

DISPLAY DEVICE

CROSS-REFERENCE TO RELATED APPLICATION

This application claims priority to and the benefit of Korean Patent Application No. 10-2018-0173828 filed in the Korean Intellectual Property Office on Dec. 31, 2018, and is a division of U.S. patent application Ser. No. 16/730,248 filed on Dec. 30, 2019, the entire contents of which are incorporated by reference herein.

BACKGROUND

(a) Technical Field

The present disclosure relates to a display device.

(b) Description of the Related Art

A display device such as a liquid crystal display (LCD), a light emitting diode display, and the like includes a display panel where a plurality of pixels that can display an image are formed and a driving circuit portion that drives the display panel. Each pixel includes a pixel electrode that receives a data signal, and the pixel electrode may receive the data signal via at least one transistor.

The display panel may include a display area where the plurality of pixels are formed, and a bezel area that is disposed at the periphery of the display area and where an image cannot be displayed. Various driving circuits and wires may be disposed in the bezel area.

The display device may further include a flexible printed circuit film bonded to the display panel. The driving circuit is disposed in the flexible printed circuit film and thus transmits various driving signals to the display panel.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a display device of which a bezel area can be reduced in size, and in which reliability can be improved.

A display device according to an exemplary embodiment of the present invention includes: a first substrate and a second substrate; a plurality of signal lines that are formed on the first substrate or on the second substrate; and a plurality of side wires that are disposed on a side surface of a first edge of the first substrate and a side surface of a second edge of the second substrate, wherein the plurality of side wires are disposed apart from each other along a direction in which the first edge extends, and are connected with the plurality of signal lines, and a first thickness of the side wire disposed at ends of the first edge and the second edge is different from a second thickness of the side wire disposed inside of the first edge and the second edges.

The first thickness may be thicker than the second thickness.

The side wire having the second thickness may be disposed at a center of the first edge and the second edge, and the first thickness may be about 1.5 times the second thickness or more.

Thicknesses of the plurality of side wires may be gradually changed along a direction in which the first edge extends.

Thicknesses of at least two adjacent side wires among the plurality of side wires may be constant.

A first width of the side wire disposed at an end of the first edge and the second edge may be different from a second width of the side wire disposed inside of the first edge and the second edge.

The first width may be smaller than the second width.

A first gap between two adjacent side wires disposed at an end of the first edge and the second edge among the plurality of side wires may be different from a second gap between two adjacent side wires that are disposed inside of the first edge and the second edge (i.e., between the side wires disposed at the ends of the first edge and the second edge).

The first gap may be smaller than the second gap.

A side surface of the first edge and a side surface of the second edge may form a curved surface The display device may further include a flexible printed circuit film that is connected with a side surface of the first edge and a side surface of the second edge, wherein the flexible printed circuit film may include a plurality of connection wires that are electrically connected with the plurality of side wires.

The flexible printed circuit film may be curved along a direction in which the first edge extends.

The first edge and the second edge may extend parallel to each other.

A display device according to exemplary embodiment includes: a substrate; a plurality of signal lines that are formed on a main surface of the substrate; and a plurality of side wires that are disposed on a side surface of the substrate, wherein the plurality of side wires are disposed apart from each other, an extension direction of the side wire is different from an extension direction of the signal line, and a first thickness of the side wire disposed at an end of the side surface of the substrate is thicker than a second thickness of the side wire that is disposed at a center of the side surface of the substrate.

Thicknesses of the plurality of side wires may be gradually changed.

Thicknesses of at least two adjacent side wires among the plurality of side wires may be constant.

At least one of a width of the side wire and a gap between two adjacent side wires among the plurality of side wires may be different according to a position of the side wire.

The side surface of the substrate may form a curved surface.

A display device according to an exemplary embodiment includes: a first substrate and a second substrate; a plurality of signal lines that are formed on the first substrate or on the second substrate; and a plurality of side wires that are disposed at a side surface of a first edge of the first substrate and a side surface of a second edge of the second substrate, wherein the plurality of side wires are disposed apart from each other along an extension direction of the first edge and the second edges, and are connected with the plurality of signal lines, and a side surface of the first edge of the first substrate and a side surface of the second edge of the second substrate form a concave surface.

Thicknesses of at least two side wires among the plurality of side wires may be different from each other.

According to exemplary embodiments of the present invention, a bezel area of the display device can be reduced and reliability of the display device can be improved.

DETAILED DESCRIPTION OF THE EMBODIMENTS

Figure 1:
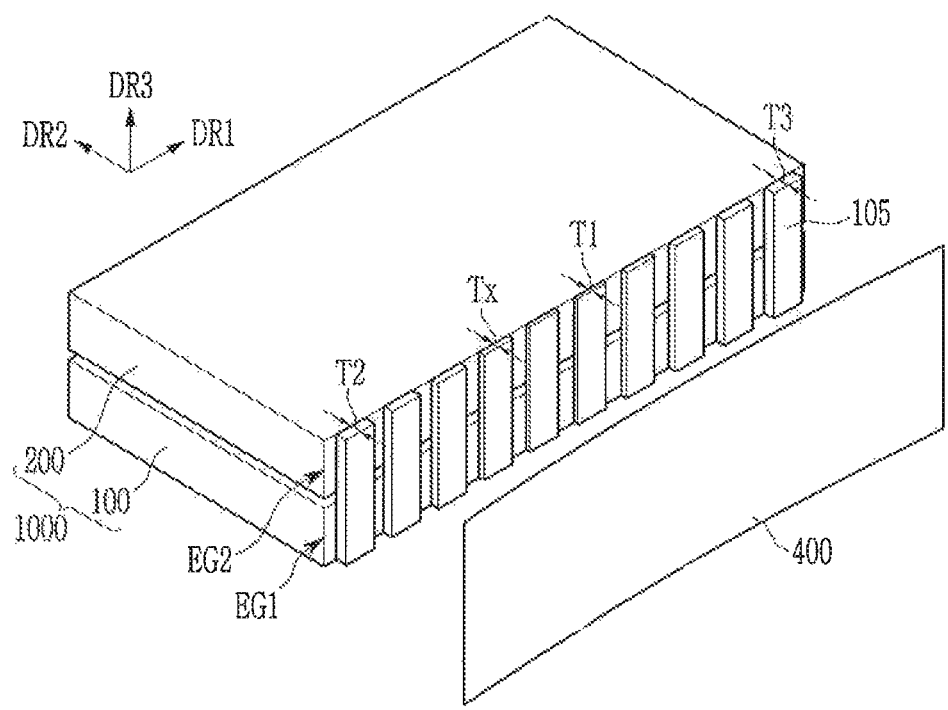
FIG. 1 is a perspective view of a display device according to an exemplary embodiment of the present invention.

The present disclosure describes a display device that forms a more secure bond between the edges of a flexible printed circuit (FPC) and side surfaces of substrates within the device. The FPC may include a driving circuit that transmits various driving signals to the display panel. However, in some cases, the edges of the FPC may not be securely bonded within the display device, or the bonds between the FPC and the display device may weaken over time. This may interfere with the form or the function of the display device and limit the durability of the device.

Therefore, embodiments of the present disclosure describe a curved surface for bonding a partially rigid FPC, so that when the FPC is bonded to the curved surface, the edges of the FPC will be subject to a restoring force (i.e., in the opposite direction of the bend) that serves to press the edges of the FPC up against the curved surface. In some cases, the curvature of the surface may be achieved by using differently sized side wires (i.e., thicker side wires at the edges and thinner side wires toward the center) at the ends of the substrate edges. In other examples, the curvature is due a curved edge of a substrate.

By curving the FPC, and creating a bond that is reinforced by the restorative force of the FPC, the present disclosure provides for a display device that includes a more durable bond between the FPC and the bonded surface, which increases the overall durability and reliability of the device.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in the drawings, the size and thickness of each element are arbitrarily represented for better understanding and ease of description, but the present invention is not limited thereto. In the drawings, the thickness of layers, films, panels, regions, etc., are exaggerated for clarity. In the drawings, for understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In the entire specification, the term "in a plan view (also referred to as on a plane)" implies a view for observing a plane that is parallel with two crossing directions (e.g., a first direction DR1 and a second direction DR2), and the term "in a cross-sectional view" implies a view for observing a plane cut along a direction (e.g., a third direction DR3) that is perpendicular to the plane that is parallel with the first direction DR1 and the second direction DR2. Further, when two constituent elements overlap, it implies that two constituent elements overlap in the third direction DR3 (e.g., a direction perpendicular to the top surface of a substrate), if there is no particular mention to the contrary.

First, referring to FIG. 1, FIG. 2, FIG. 3, and FIG. 4, a display device according to an exemplary embodiment of the present invention will be described.

Figure 2:
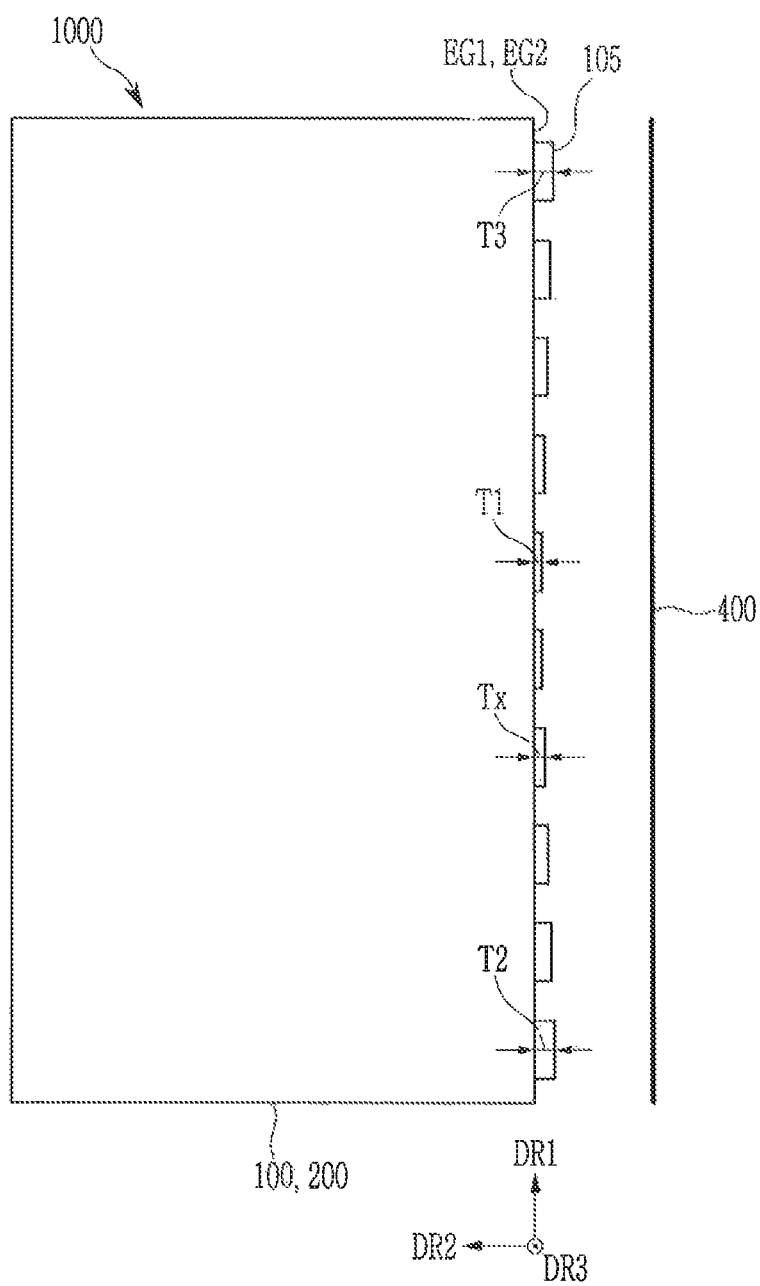
FIG. 2, FIG. 3, FIG. 4, FIG. 5, FIG. 6, FIG. 7, and FIG. 8 are top plan views of display devices according to exemplary embodiments of the present invention.
Figure 3:
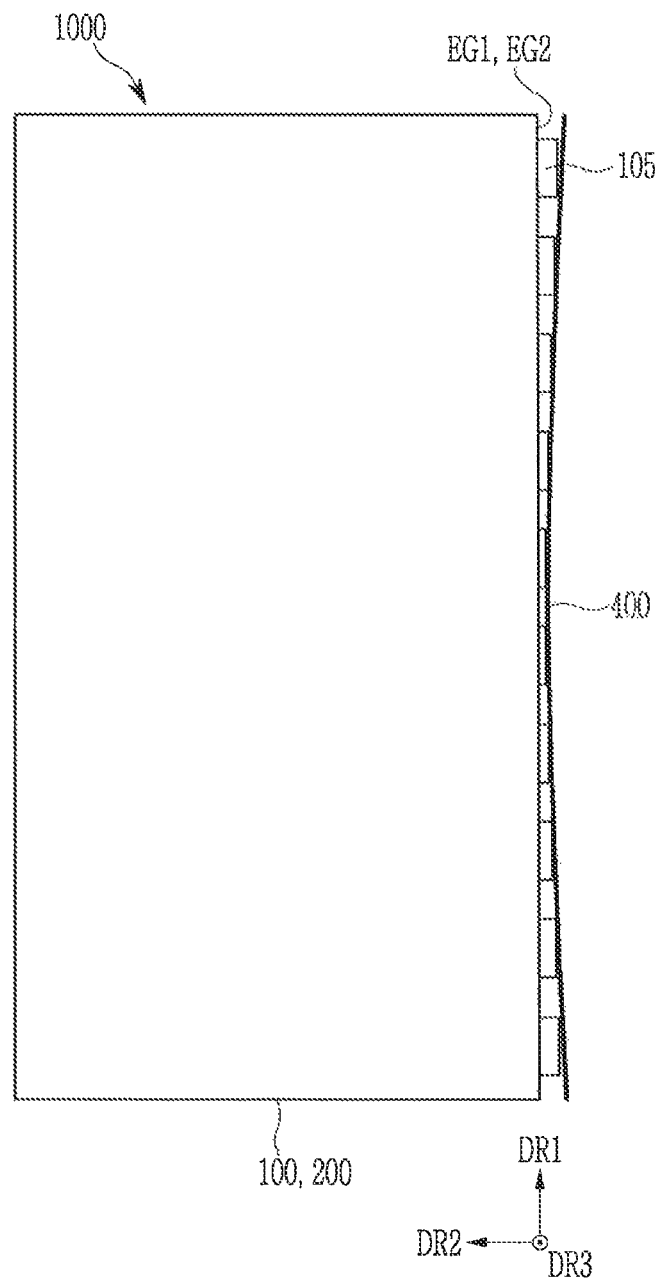
Figure 4:
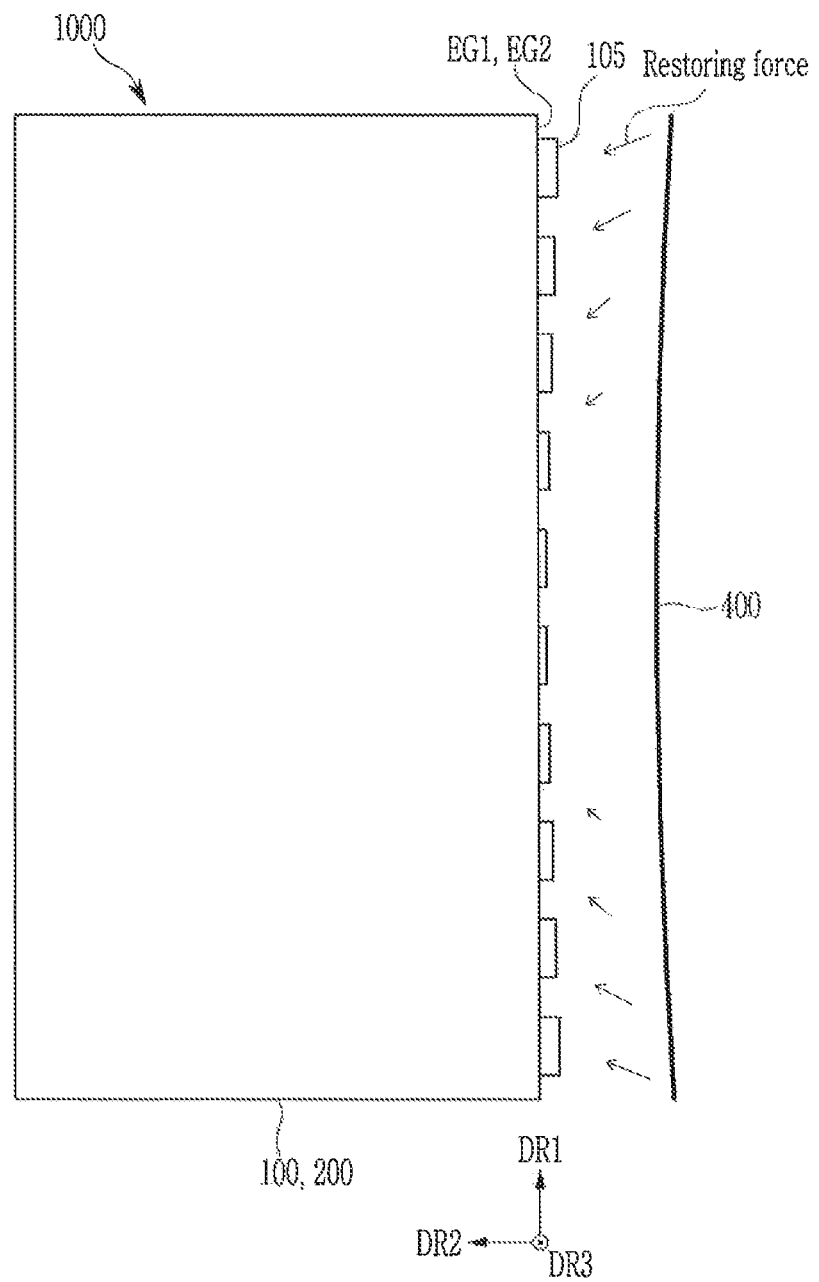

FIG. 1 is a perspective view of a display device according to an exemplary embodiment of the present invention, FIG. 2 is a top plan view of the display device according to an exemplary embodiment of the present invention, which shows a state before a flexible printed circuit film is bonded, FIG. 3 is a top plan view of the display device according to an exemplary embodiment of the present invention, which shows a state after the flexible printed circuit film is bonded, and FIG. 4 is an exploded top plan view of the flexible printed circuit film in the display device of FIG. 3.

A display device according to an exemplary embodiment includes a display panel 1000 that includes a first substrate 100 and a second substrate 200, which are bonded to each other.

A main side of the first substrate 100 and a main side of the second substrate 200 may be disposed to be parallel with each other. In FIG. 1, the main side of the first substrate 100 and the main side of the second substrate 200 extend in parallel with the first direction DR1 and the second direction DR2.

The first substrate 100 and the second substrate 200 may respectively have fixed shapes, or may be flexible. The first substrate 100 and the second substrate 200 may be made of glass, plastic, and the like. When the first substrate 100 and the second substrate 200 are flexible, they may include various plastics such as polyethylene terephthalate (PET), polyethylene naphthalate (PEN), polycarbonate (PC), polyarylate (PAR), polyetherimide (PEI), and the like, or a metal thin film or ultra-thin glass.

An edge EG1 of the first substrate 100 and an edge EG2 of the second substrate 200 may extend while being parallel with each other. The edge EG1 of the first substrate 100 and the edge EG2 of the second substrate 200 may indicate borders of the first substrate 100 and the second substrate 200 when the display panel 1000 is viewed from the third direction DR3. The edge EG1 of the first substrate 100 and the edge EG2 of the second substrate 200 may extend substantially in parallel with the first direction DR1.

According to an exemplary embodiment, the edge EG1 of the first substrate 100 and the edge EG2 of the second substrate 200 may extend substantially straightly. Specifically, the edge EG1 of the first substrate 100 and the edge EG2 of the second substrate 200 may extend straightly along the first direction DR1. A side surface of the edge EG1 of the first substrate 100 and a side surface of the edge EG2 of the second substrate 200 may form a plane that is parallel with the first direction DR1. Here, the side surface of the edge EG1 implies a side surface that is disposed at the edge EG1, while being connected with a main surface of the first substrate 100, and in FIG. 1, the side surface of the edge EG1 is illustrated as a plane that is parallel with the first direction DR1 and the third direction DR3. The side surface of the edge EG2 implies a side surface that is disposed at the edge EG2, while being connected with a main surface of the second substrate 200, and in FIG. 1, the side surface of the edge EG2 is illustrated as a plane that is parallel with the first direction DR1 and the third direction DR3.

The side surface of the edge EG1 of the first substrate 100 and the side surface of the edge EG2 of the second substrate 200 may be disposed on the same plane, or may be disposed on two planes that are not aligned with each other. A direction in which the side surface of the edge EG1 of the first substrate 100 extends and a direction in which the side surface of the edge EG2 of the second substrate 200 extends may be the same as or different from each other. FIG. 1 shows an example where the side surface of the edge EG1 of the first substrate 100 and the side surface of the edge EG2 of the second substrate 200 are disposed on the same plane and extend in the same direction, but this is not restrictive.

At least one of the side surface of the edge EG1 of the first substrate 100 and the side surface of the edge EG2 of the second substrate 200 may be perpendicular to the main surfaces of the first substrate 100 and the second substrate 200, but this is not restrictive. That is, at least one of the side surface of the edge EG1 of the first substrate 100 and the side surface of the edge EG2 of the second substrate 200 may form an inclined surface that is not perpendicular to the main surfaces of the first substrate 100 and the second substrate 200. Alternatively, the side surface of the edge EG1 of the first substrate 100 and the side surface of the edge EG2 of the second substrate 200 may be curved with reference to at least one line extending along the first direction DR1, thereby forming a curved surface. Such a curved surface may include at least two planes that extend in different directions.

Hereinafter, the edge EG1 of the first substrate 100 and the edge EG2 of the second substrate 200 will be referred to as edges EG1 and EG2 of the display panel, and the side surface of the edge EG1 of the first substrate 100 and the side surface of the edge EG2 of the second substrate 200 will be referred to as side surfaces of the edges EG1 and EG2 of the display panel 1000.

A plurality of side wires 105 may be disposed on at least one of the side surface of the edge EG1 of the first substrate 100 and the side surface of the edge EG2 of the second substrate 200. That is, the plurality of side wires 105 may be formed on both of the side surface of the edge EG1 of the first substrate 100 and the side surface of the edge EG2 of the second substrate 200, or may be formed on only one of the side surfaces of the edges EG1 and EG2 of the first substrate 100 and the second substrate 200. In the present exemplary embodiment, the former case will be exemplarily described.

The plurality of side wires 105 are separated from each other, and may be aligned in one direction on the side surfaces of the edges EG1 and EG2. For example, the plurality of side wires 105 may be arranged at a distance from each other along the first direction DR1.

Each of the side wires 105 may extend substantially in the third direction DR3, and may extend while crossing a space or a boundary between the first substrate 100 and the second substrate 200.

Referring to FIG. 1 to FIG. 4, the display device according to an exemplary embodiment of the present invention may further include a flexible printed circuit (FPC) film 400 that is electrically connected with the plurality of side wires 105 of the display panel 1000. The flexible printed circuit film 400 may have elasticity such that the flexible printed circuit film 400 can be restored to a flat surface after being deformed.

A thickness Tx of each of the plurality of side wires 105 may be the thickness of the side surface of the edge EG1 of the first substrate 100 and the side surface of the edge EG2 of the second substrate 200 in a normal direction. For example, it may be the thickness in the second direction DR2 in FIG. 1.

Thicknesses T2 and T3 of the side wires 105, disposed at the ends of the edges EG1 and EG2 of the first and second substrates 100 and 200, may be different from the thickness of a side wire 105 disposed inside of the edges EG1 and EG2 (e.g., the thickness T1 of the side wire 105 disposed at or near the center of the edges EG1 and EG2). Here, the ends, the center, or the inside of the edges EG1 and EG2 may imply locations in the first direction DR1 of the edges EG1 and EG2 extended in the first direction DR1, and will refer the same meaning hereinafter.

Specifically, the thicknesses T2 and T3 of the side wires 105 disposed at ends of the edge EG1 of the first substrate 100 and the edge EG2 of the second substrate 200 may be larger than the thickness T1 of the side wire 105 disposed at or near the center of the edges EG1 and EG2. More specifically, the thicknesses T2 and T3 of the side wires 105 disposed at the end of the edge EG1 and the edge EG2 may be about 1.5 times the thickness T1 of the side wire 105 disposed at or near the center of the edges EG1 and EG2 (or more).

As described, the thickness Tx of each of the plurality of side wires 105 may change depending on an aligned position of the side wires 105. That is, the thickness Tx of the side wire 105 may change along the first direction DR1. Specifically, the thickness Tx of the side wires 105 may be increased when the position of a side wire 105 is closer to the end from the center of the edges EG1 and EG2.

The thickness Tx of the side wires 105 may be continuously, but gradually changed with respect to the entire plurality of side wires 105. However, there may exist an area in which the thickness Tx of at least two side surfaces of side wires 105 which neighbor each other is constant.

An exposed surface of a side wire 105 bonded with the flexible printed circuit film 400 may be called a bonding surface, and as shown in FIG. 2, a height of the bonding surface of a side wire 105 with reference to side surfaces of the edges EG1 and EG2 may gradually increase toward the ends of the edges EG1 and EG2.

Thus, as shown in FIG. 3, the flexible printed circuit film 400 may be bonded to the side surfaces of the edges EG1 and EG2 of the display panel 1000, while being curved along the first direction DR1. The flexible printed circuit film 400 may be curved to be approximately symmetrical with respect to the center portion of the edges EG1 and EG2 of the display panel 1000, but this is not restrictive. A surface of the flexible printed circuit film 400 facing toward the display panel 1000 may form a convex surface.

The curved flexible printed circuit film 400 bonded to the display panel 1000 may have elasticity to be restored to a flat surface, and thus, as shown in FIG. 4, opposite end portions of the flexible printed circuit film 400 can be continuously subject to a restoring force toward the display panel 1000. Accordingly, bonding strength of the flexible printed circuit film 400 near the side surfaces of the edges EG1 and EG2 of the display panel 1000 can be reinforced, and product reliability of the display device can be improved.

Next, display devices according to exemplary embodiments of the present invention will be respectively described with reference to FIG. 5 to FIG. 8, together with the above-described FIG. 1 to FIG. 4.

FIG. 5, FIG. 6, FIG. 7, and FIG. 8 are top plan views of display devices according to exemplary embodiments of the present invention. Specifically, they are exploded top plan views of flexible printed circuit films bonded to display panels like the above-described FIG. 4.

Figure 5:
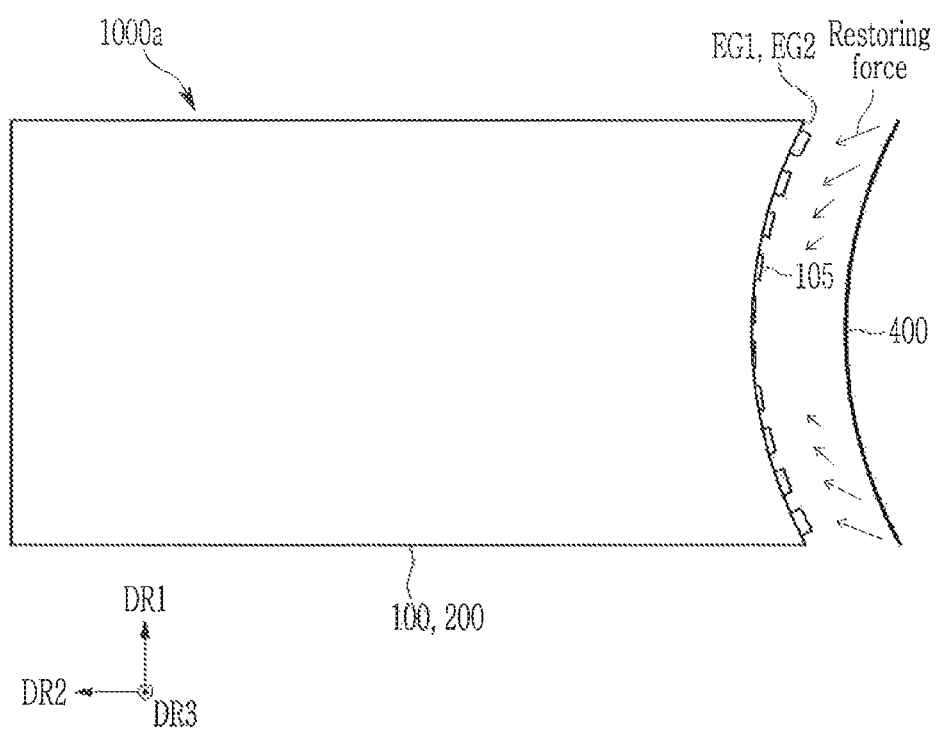

First, referring to FIG. 5, a display panel 1000a of a display device according to the present exemplary embodiment is similar to the above-described exemplary embodiment, except that an edge EG1 of a first substrate 100 and an edge EG2 of a second substrate 200 are curved when viewed from a third direction DR3. For example, the edge EG1 of the first substrate 100 and the edge EG2 of the second substrate 200 may be curved along a first direction DR1, and a side surface of the edge EG1 of the first substrate 100 and a side surface of the edge EG2 of the second substrate 200 may form curved surfaces curved along the first direction DR1.

The edge EG1 of the first substrate 100 and the edge EG2 of the second substrate 200 may be curved to be approximately symmetrical with reference to a center portion of the edges EG1 and EG2, but this is not restrictive. Viewed from the third direction DR3, the edge EG1 of the first substrate 100 and the edge EG2 of the second substrate 200 may form a shape that is bent toward the inside of the display panel 1000a, and side surfaces of the edges EG1 and EG2 may form a concave surface.

In the present exemplary embodiment, the flexible printed circuit film 400 may be bonded to the side surfaces of the edges EG1 and EG2 of the display panel 1000a, while being curved along the first direction DR1. The flexible printed circuit film 400 may be curved to be approximately symmetrical with respect to the center portion of the edges EG1 and EG2 of the display panel 1000, but this is not restrictive. A surface of the flexible printed circuit film 400, facing toward the display panel 1000, may form a convex surface.

The curved flexible printed circuit film 400 has elasticity to be restored to a flat surface, and thus, opposite end portions of the flexible printed circuit film 400 can be continuously subject to a restoring force toward the display panel 1000a. Accordingly, the bonding strength of the flexible printed circuit film 400 near the side surfaces of the edges EG1 and EG2 of the display panel 1000a can be reinforced.

Figure 6:
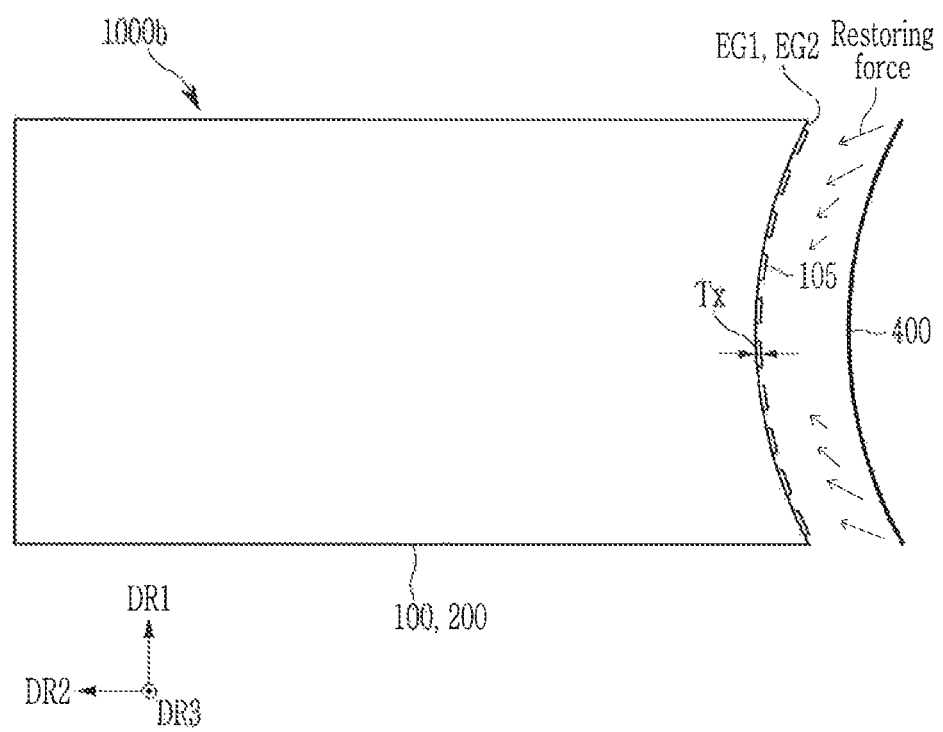

Next, referring to FIG. 6, a display panel 1000b of a display device according to the present exemplary embodiment is similar to the exemplary embodiment shown in FIG. 4, except that a thickness Tx of a plurality of side wires 105 disposed on side surfaces of edges EG1 and EG2 are constant according to positions of the side wires 105.

In this example, an edge EG1 of a first substrate 100 and an edge EG2 of a second substrate 200 form curved lines and the side surfaces of the edges EG1 and EG2 form curved surfaces along a first direction DR1, and thus a flexible printed circuit film 400 may be bonded to the side surfaces of the edges EG1 and EG2 of the display panel 1000b while being curved along the first direction DR1. Since the curved flexible printed circuit film 400 has elasticity to be restored to a flat surface, opposite end portions of the flexible printed circuit film 400 can be continuously subject to a restoring force toward the display panel 1000b. Accordingly, bonding strength of the flexible printed circuit film 400 near the side surfaces of the edges EG1 and EG2 of the display panel 1000b can be reinforced.

Figure 7:
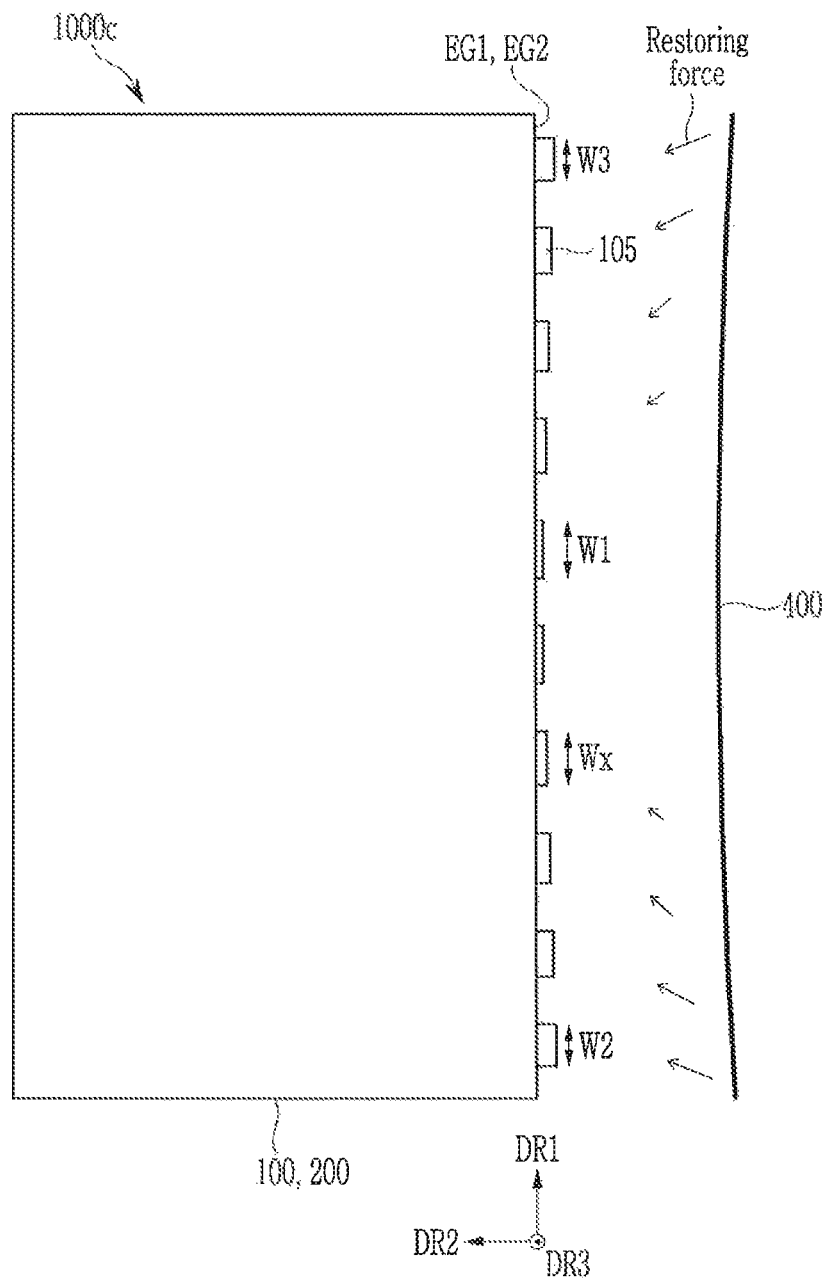

Next, referring to FIG. 7, a display panel 1000c of a display device according to the present exemplary embodiment is similar to the exemplary embodiment shown in FIG. 6, except that widths W2 and W3 of side wires 105 disposed at ends of an edge EG1 of a first substrate 100 and an edge EG2 of a second substrate 200 may be different from the width W1 of a side wire 105 disposed inside of the edges EG1 and EG2, for example, a side wire 105 disposed at or near the center of the edges EG1 and EG2. Here, the widths W1, W2, and W3 of the side wires 105 may refer to a width of the side wire 105 in a third direction DR3.

Specifically, the widths W2 and W3 of the side wires 105 disposed at the ends of the edges E1 and EG2 of the first and second substrates 100 and 200 may be smaller than the width W1 of the side wire 105 disposed at or near the center of the edges EG1 and EG2.

As described, widths Wx of the plurality of side wires 105 may change depending on a position of each side wire 105. That is, the widths Wx of the side wires 105 may change along a first direction DR1. Specifically, the widths Wx of the side wires 105 may gradually decrease as the position of the side wires 105 gets closer to the ends of the edges EG1 and EG2 and away from the center of the edges EG1 and EG2. The widths Wx of the side wires 105 may be continuously, gradually changed with respect to the entire plurality of side wires 105, and an area may exist where the widths Wx of two adjacent side wires 105 are constant.

According to another exemplary embodiment, the widths Wx of the side wires 105 may gradually increase when the positions of the side wires 105 are close to the ends of the edges EG1 and EG2 and away from the center of the edges EG1 and EG2. In this case, the widths W2 and W3 of the side wires 105 disposed at the ends of the edges EG1 and EG2 of the first and second substrates 100 and 200 may be greater than the width W1 of the side wire 105 disposed at or near the center of the edges EG1 and EG2.

As shown in FIG. 7, the height of the bonding surfaces of the side wires 105 with reference to the side surfaces of the edges EG1 and EG2 may gradually increase toward the ends of the edges EG1 and EG2. Thus, the flexible printed circuit film 400 may be bonded to the side surfaces of the edges EG1 and EG2 of the display panel 1000c, while being curved along the first direction DR1. The curved flexible printed circuit film 400 has elasticity to be restored to a flat surface, and thus, opposite end portions of the flexible printed circuit film 400 can be continuously subject to a restoring force toward the display panel 1000c. Accordingly, the bonding strength of the flexible printed circuit film 400 near the side surfaces of the edges EG1 and EG2 of the display panel 1000c can be reinforced.

In addition, when the widths Wx of the side wires 105 are gradually decreased or increased toward the ends of the edges EG1 and EG2, bonding stability near the side surfaces of the edges EG1 and EG2 of the display panel 1000c of the flexible printed circuit film 400 can be increased.

Figure 8:
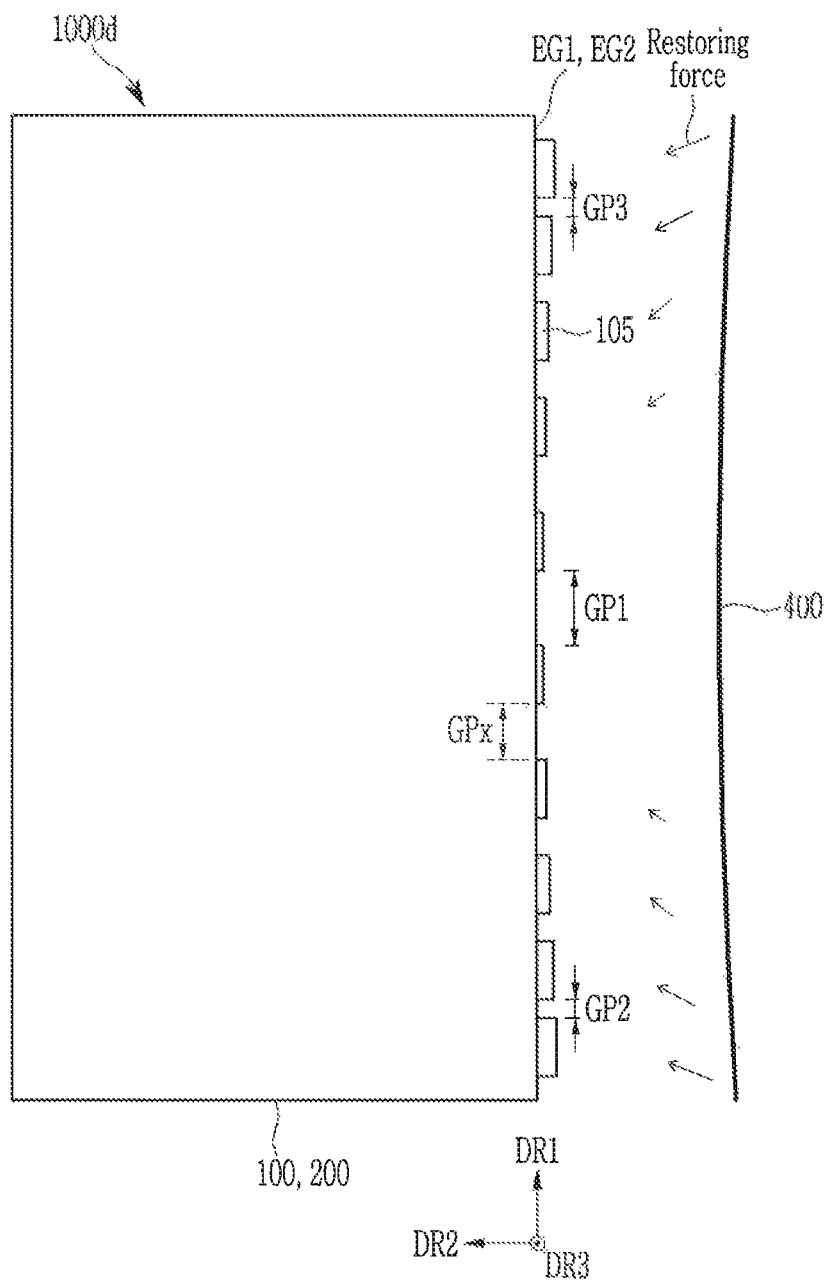

Next, referring to FIG. 8, a display panel 1000d of a display device according to the present exemplary embodiment is similar to the above-described exemplary embodiment of FIG. 1 to FIG. 4, the exemplary embodiment of FIG. 5, the exemplary embodiment of FIG. 6, and the exemplary embodiment of FIG. 7, except that gaps GP2 and GP3 between two adjacent side wires 105 disposed at the ends of edges EG1 and EG2 of first and second substrates 100 and 200 are different from a gap GP1 between two adjacent side wires 105 disposed inside of the edges of the edges EG1 and EG2, for example, a gap GP1 between two adjacent side wires 105 disposed at or near the center of the edges EG1 and EG2. The gaps GP1, GP2, and GP3 between two adjacent side wires 105 may refer to the gap between two adjacent side wires 105 in a first direction DR1.

Specifically, the gaps GP2 and GP3 between two adjacent side wires 105 disposed at the ends of the edges EG1 and EG2 of the first and second substrates 100 and 200 may be smaller than the gap GP1 between the two adjacent side wires 105 disposed at or near the center of the edges EG1 and EG2.

As described herein, the gap GPx between two adjacent side wires 105 may change depending on the position of the side wire 105. That is, the gaps GPx between two adjacent side wires 105 may change along the first direction DR1. Specifically, the gaps GPx between the two adjacent side wires 105 may gradually decrease as the positions of the side wires 105 get closer to the ends of the edges EG1 and EG2 and away from the center of the edges EG1 and EG2. The gap GPx between the two adjacent side wires 105 may be continuously, gradually changed with respect to the enter edges EG1 and EG2, and an area may exist where the gaps GPx between two adjacent side wires 105 are constant.

According to another exemplary embodiment, the gaps GPx between two adjacent side wires 105 may gradually increase as the positions of the side wires 105 get closer to the ends of the edges EG1 and EG2 and away from the center of the edges EG1 and EG2. In this case, the gaps GP2 and GP3 between two adjacent side wires 105 disposed at the ends of edges EG1 and EG2 may be greater than the gap GP1 of two adjacent side wires 105 disposed at or near the center of the edges EG1 and EG2.

As shown in FIG. 8, the height of the bonding surfaces of the plurality of side wires 105 may gradually increase toward the ends of the edges EG1 and EG2, with reference to the side surfaces of the edges EG1 and EG2. Thus, the flexible printed circuit film 400 may be bonded to the side surfaces of the edges EG1 and EG2 of the display panel 1000d, while being curved along the first direction DR1. The curved flexible printed circuit film 400 has elasticity to be restored to a flat surface, and thus, opposite end portions of the flexible printed circuit film 400 can be continuously subject to a restoring force toward the display panel 1000d. Accordingly, the bonding strength of the flexible printed circuit film 400 near the side surfaces of the edges EG1 and EG2 of the display panel 1000d can be reinforced.

In addition, when the gaps GPx between two adjacent side wires 105 gradually decrease or increased toward the ends of the edges EG1 and EG2, the bonding stability near the side surfaces of the edges EG1 and EG2 of the display panel 1000d of the flexible printed circuit film 400 can be increased.

Next, a display device according to an exemplary embodiment will be described with reference to FIG. 9 to FIG. 14, together with the above-described drawings.

Figure 9:
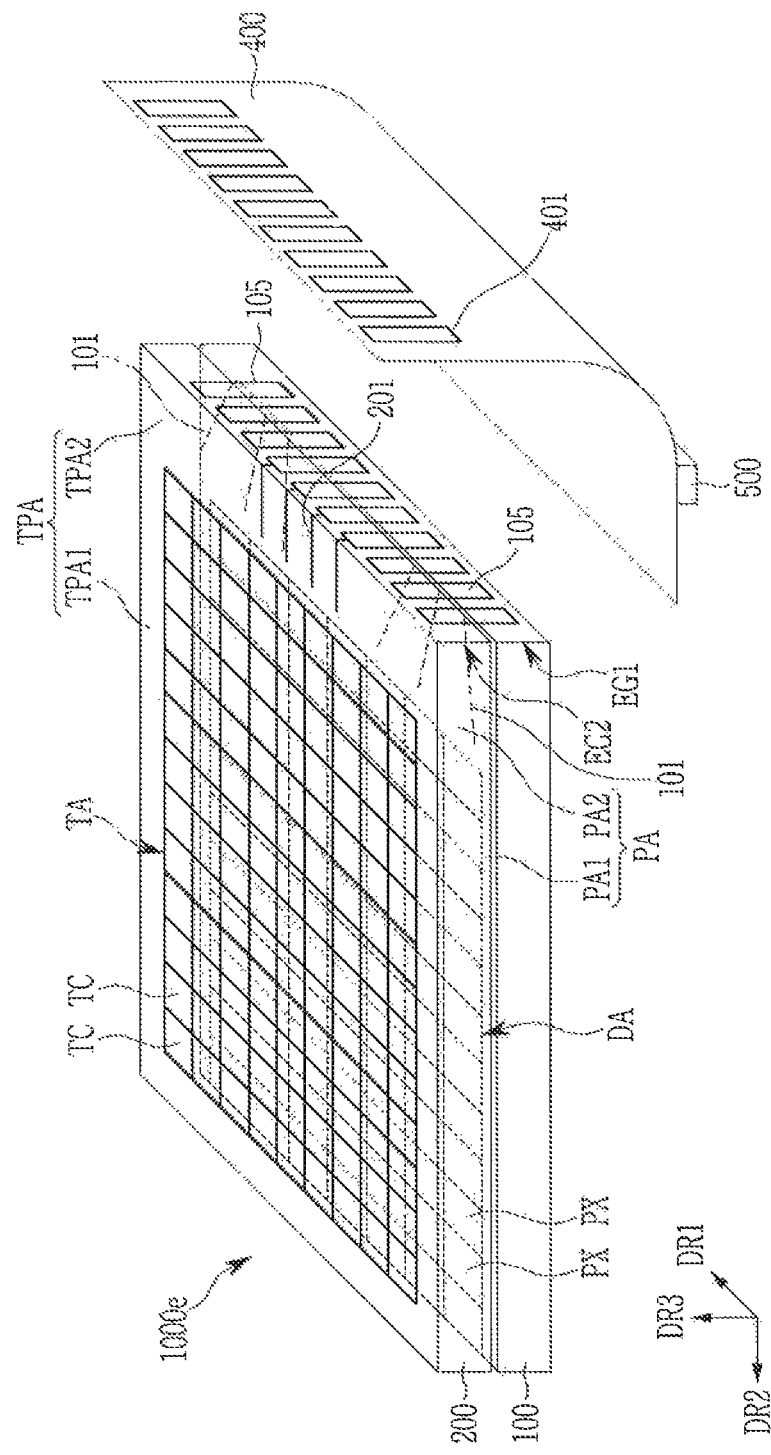
FIG. 9 is a perspective view of a display device according to an exemplary embodiment of the present invention.

FIG. 9 is a perspective view of a display device according to an exemplary embodiment of the present invention, and FIG. 10, FIG. 11, FIG. 12, FIG. 13, and FIG. 14 are cross-sectional views of the display device according to FIG. 9.

Referring to FIG. 9, a display panel 1000e according to an exemplary embodiment may be similar to the display panels 1000, 1000a, 1000b, 1000c, and 1000d of the display devices according to the above-described exemplary embodiments, except that a plurality of pixels PX are formed at a first substrate 100 and a plurality of touch cells TC are formed at a second substrate 200.

The first substrate 100 may include a display area DA, which is an area where an image can be displayed, and a bezel area PA, which is an area disposed at the periphery of the display area DA and where an image cannot be displayed.

The plurality of pixels PX and a plurality of signal lines are formed in the display area DA. As a unit for displaying an image, each pixel PX may include at least one pixel electrode, and may emit light having a luminance that corresponds to a grayscale of an input image signal. In the present disclosure, a pixel PX may imply a unit area which can emit light in a plan view, and may include constituent elements such as a transistor and a light emitting element, which may be formed to emit light on a cross-sectional view.

The bezel area PA may include a first bezel area PA1 that is disposed between an edge excluding an edge EG1 of the first substrate 100, and the display area DA. The bezel area PA may also include a second bezel area PA2 that is disposed between the edge EG1 of the first substrate 100 and the display area DA.

The plurality of signal lines may extend to the bezel area PA, and the portion of the signal lines extending to the second bezel area PA2 are called peripheral signal lines 101. The peripheral signal lines 101 may be electrically connected with parts of the plurality of side wires 105, which are formed at the edge EG1 of the first substrate 100 and the edge EG2 of the second substrate 200.

An end portion of the peripheral signal line 101, exposed at the edge EG1, may be electrically connected with the side wire 105.

The first substrate 100 where the pixels PX are formed is also called a display portion.

The second substrate 200 may include a touch area TA, which is an area where a touch from the outside of the display device can be sensed, and a touch bezel area TPA that is disposed at the periphery of the touch area TA.

A plurality of touch cells TC may be formed in the touch area TA. The touch cells TC include as least one touch electrode, which, as a unit for sensing external touch, may sense external touch using various methods. For example, the touch electrode may be a mutual capacitive type or a self-capacitive type. The touch cells TC may emit a touch output signal upon sensing a touch.

The touch bezel area TPA may include a first touch bezel area TPA1 that is disposed between an edge of the second substrate 200, excluding the edge EG2, and the touch area TA, and a second touch bezel area TPA2 that is disposed between the edge EG2 of the second substrate 200 and the touch area TA. In a plan view, the second touch bezel area TPA2 may overlap the second bezel area PA2 of the first substrate 100.

A plurality of touch signal lines that are connected with the touch cells TC may be disposed in the touch bezel area TPA. The touch signal lines may extend to the second bezel area PA2. Portions of the touch signal lines, extended to the second bezel area PA2, are called touch peripheral signal lines 201. Each of the touch peripheral signal lines 201 may be electrically connected with a part of each of the plurality of side wires 105 formed on side surfaces of the edges EG1 and EG2. End portions of the touch peripheral signal lines 201, exposed at the edge EG2, may be electrically connected with the side wires 105.

The second substrate 200 where the touch cells TC and the touch signal lines are formed is also called a touch portion.

A driving circuit portion 500 may be connected to a flexible printed circuit film 400, and a plurality of connection wires 401 may be formed in the flexible printed circuit film 400. A portion of the flexible printed circuit film 400 in which the plurality of connection wires 401 are formed may be attached to side surfaces of the edges EG1 and EG2 of the display panel 1000e and thus may be electrically connected with the display panel 1000e. The flexible printed circuit film 400, excluding the portion attached to the side surfaces of the edges EG1 and EG2 of the display panel 1000e, may be curved below the display panel 1000e, and the driving circuit portion 500 may be disposed on the side of the flexible printed circuit film 400 disposed below the display panel 1000e.

The plurality of connection wires 401 may extend to the driving circuit portion 500 and may be connected thereto.

Figure 10:
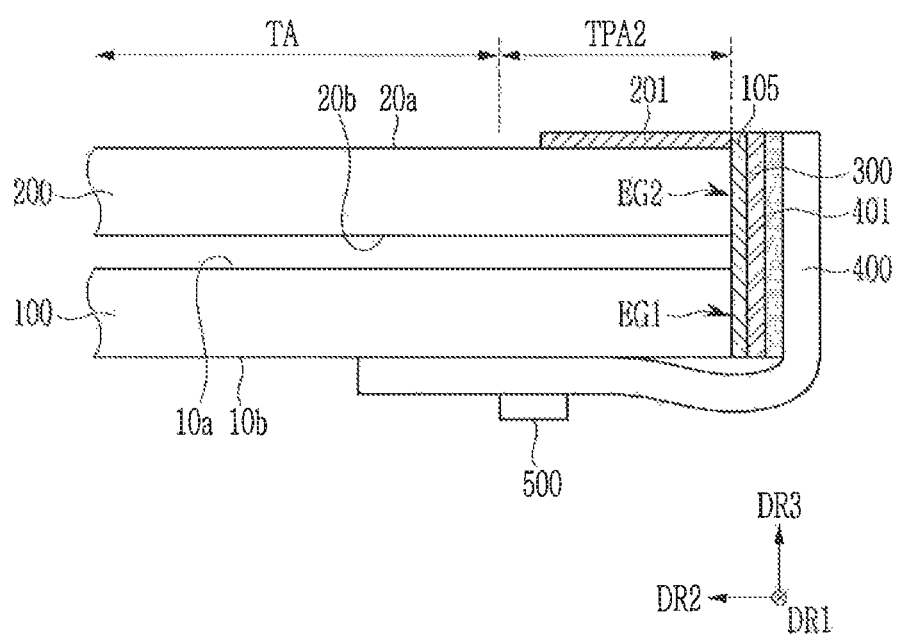
FIG. 10, FIG. 11, FIG. 12, FIG. 13, and FIG. 14 are cross-sectional views of the display device shown in FIG. 9, and FIG. 15 and FIG. 16 are cross-sectional views of pixels of display devices according to exemplary embodiments of the present invention.
Figure 11:
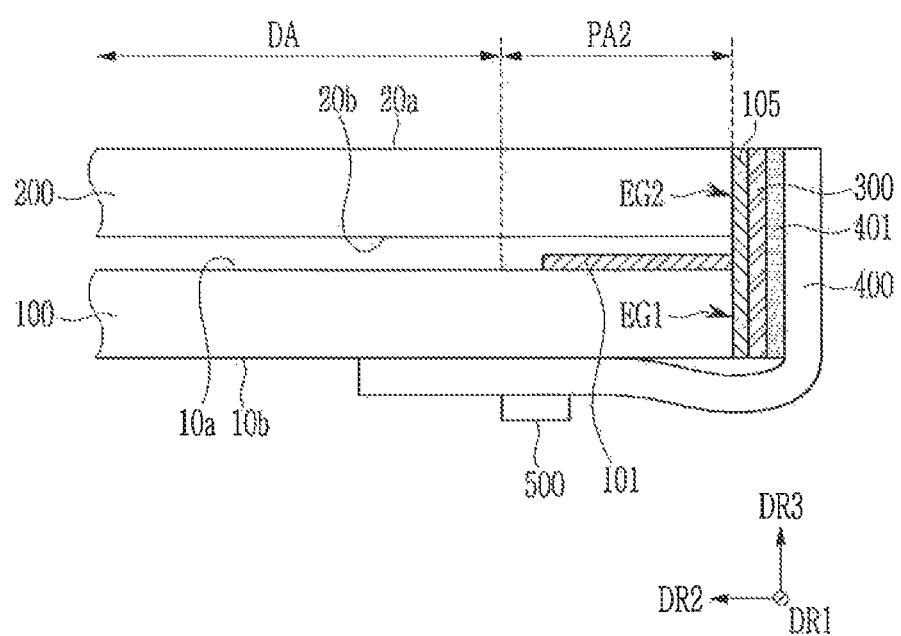

Referring to FIG. 10 and FIG. 11, together with FIG. 9, the first substrate 100 includes a top surface 10a that forms the main surface, and a bottom surface 10b. The second substrate 200 includes a top surface 20a that forms a main surface, and a bottom surface 20b. The top surface 10a of the first substrate 100 and the bottom surface 20b of the second substrate 200 may face each other.

A touch peripheral signal line 201 may be formed on the top surface 20a of the second substrate 200, and a peripheral signal line 101 may be formed on the top surface 10a of the first substrate 100.

The side wires 105 may be conductive wires including at least one metal. A part of the side surfaces 105 may be directly connected with the touch peripheral signal lines 101, and another part may be directly connected with the peripheral signal lines 101. The side wires 105 may be formed while further extending into an area between the first substrate 100 and the second substrate 200.

A conductive connector 300 may be disposed between the connection wires 401 formed in the flexible printed circuit film 400 and the side wires 105. The connector 300 may be an anisotropic conductive film ACF that includes, for example, a conductive ball, and the connector 300 may be a conductive connection electrode formed by melting the conductive ball. The connector 300 may electrically connect the connection wires 401 of the flexible printed circuit film 400 and the side wires 105.

The flexible printed circuit film 400 is curved below the first substrate 100, and a portion of the flexible printed circuit film 400 disposed below the first substrate 100 may be fixed to the bottom surface 10b of the first substrate 100.

In one example, the driving circuit portion 500 may be disposed on a bottom surface of the portion of the flexible printed circuit film 400, and fixed to the bottom surface 10b of the first substrate 100. In another example, the driving circuit portion 500 may be disposed between the portion of the flexible printed circuit film 400 fixed to the bottom surface 10b of the first substrate 100 and the bottom surface 10b of the first substrate 100.

The driving circuit portion 500 may include a display driving circuit and a touch driving circuit. The display driving circuit drives the first substrate 100, that is, a plurality of pixels PX included in the display portion, such that an image can be displayed, and the touch driving circuit may input a signal to the plurality of touch cells TC included in the touch portion or may generate contact information by receiving and processing a touch output signal. The driving circuit portion 500 may be provided as a single integrated circuit (IC) chip that includes the display driving circuit and the touch driving circuit, or may include a plurality of IC chips, each including the display driving circuit and the touch driving circuit.

Referring to FIG. 10 and FIG. 11, a part of the flexible printed circuit film 400, curved at a lower corner of the first substrate 100, may be separated from the bottom surface 10b of the first substrate 100 such that a space may be formed. The space between the flexible printed circuit film 400 and the bottom surface 10b of the first substrate 100 may be filled with air. Alternatively, an insulation buffer member may be disposed therein.

Figure 12:
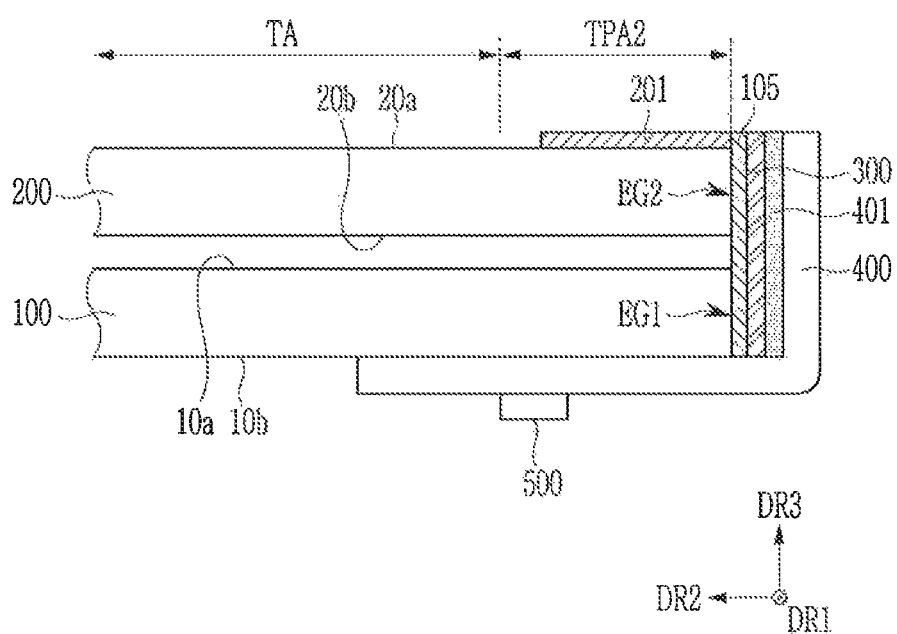
Figure 13:
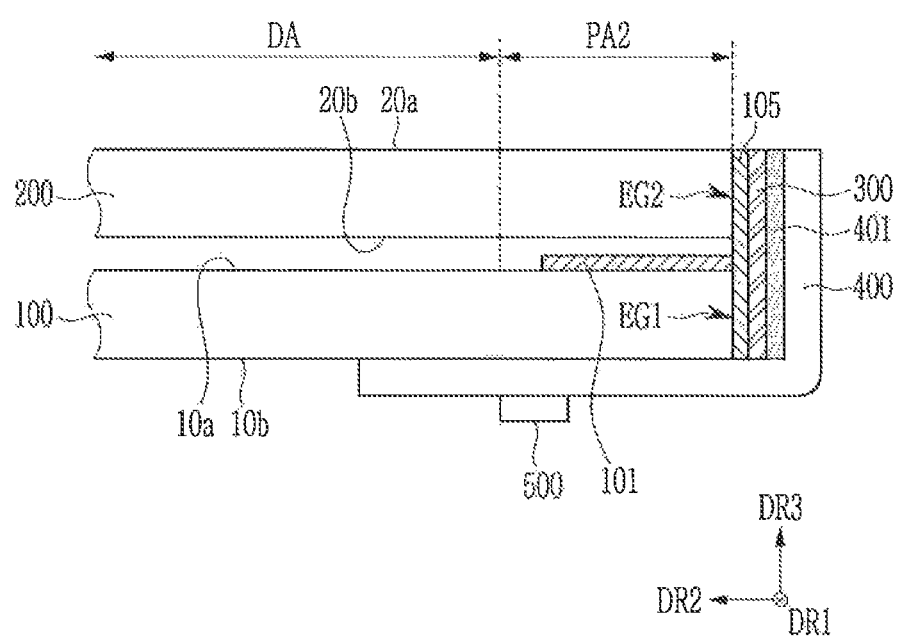

The exemplary embodiments of FIG. 12 and FIG. 13 are similar to the above-described exemplary embodiment shown in FIG. 10 and FIG. 11, except that no space is formed between the flexible printed circuit film 400 curved at a lower corner of the first substrate 100 and the bottom surface 10b of the first substrate 100, and the flexible printed circuit film 400 curved at the lower corner of the first substrate 100 and the bottom surface 10b of the first substrate 100 are bonded to each other.

Figure 14:
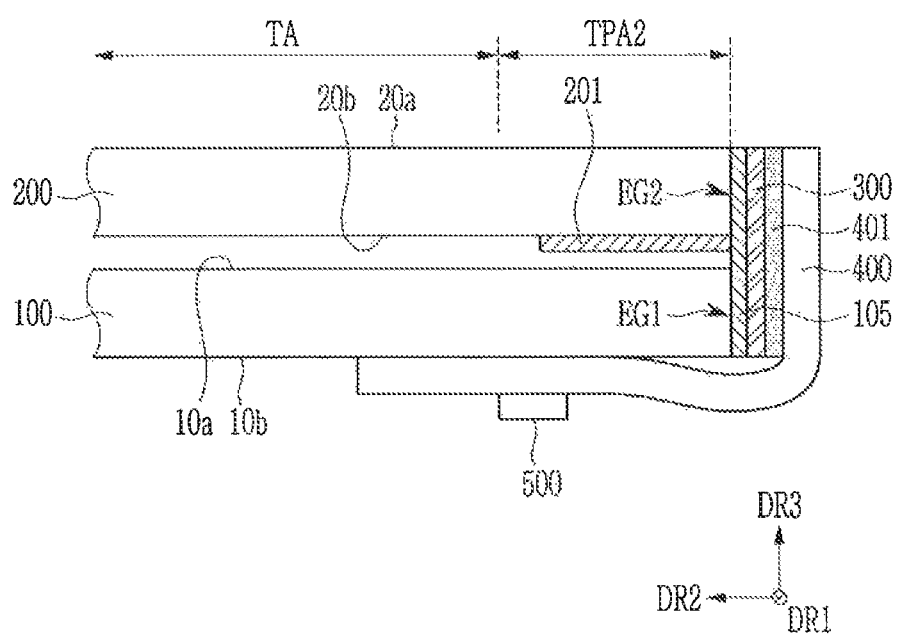

FIG. 14 illustrates an example in which the touch peripheral signal lines 201 are formed on the bottom surface 20b of the second substrate 200, unlike the above-described exemplary embodiment of FIG. 10.

Hereinafter, a cross-sectional structure of a display device according to an exemplary embodiment will be described with reference to FIG. 15 and FIG. 16, together with the above-described drawings.

Figure 15:
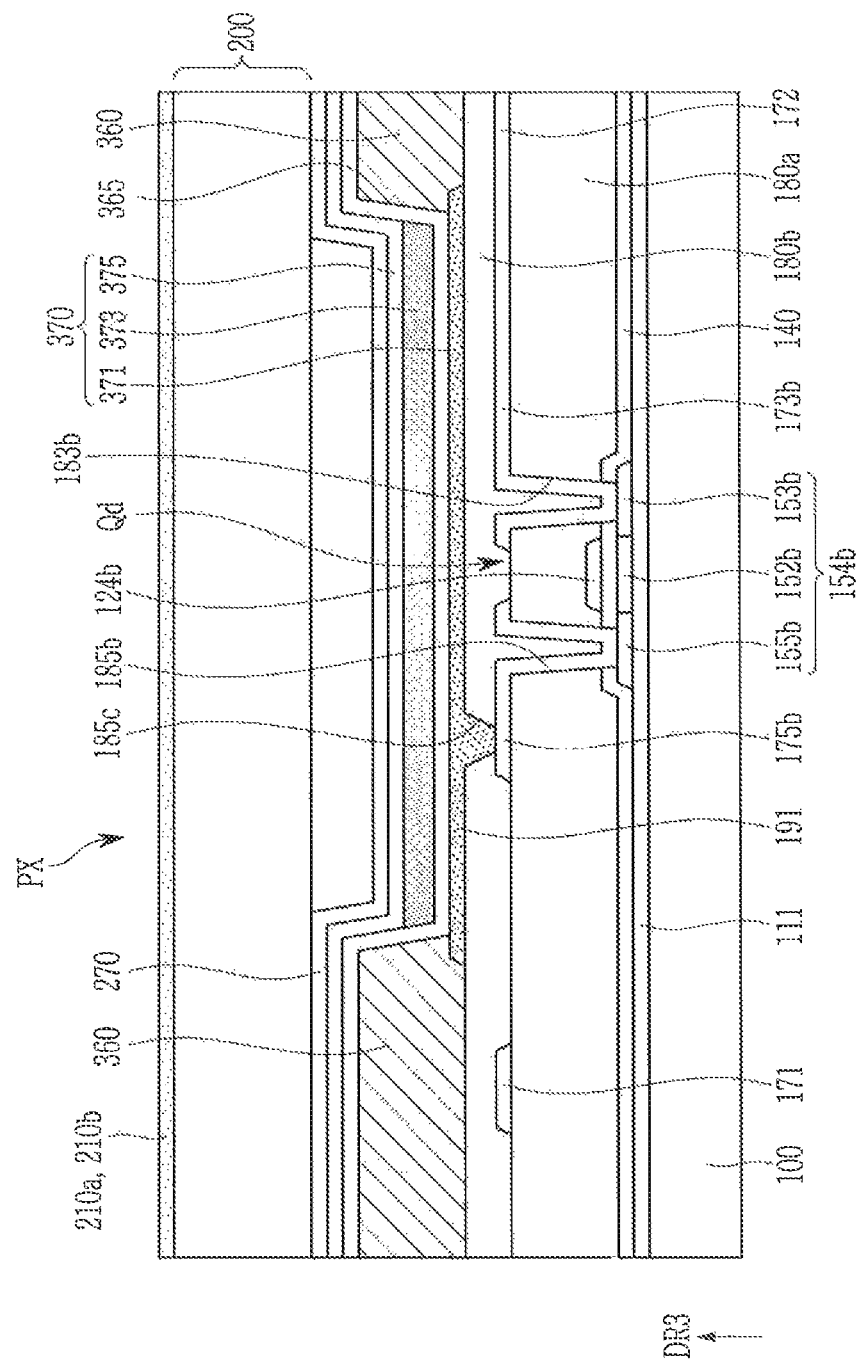
Figure 16:
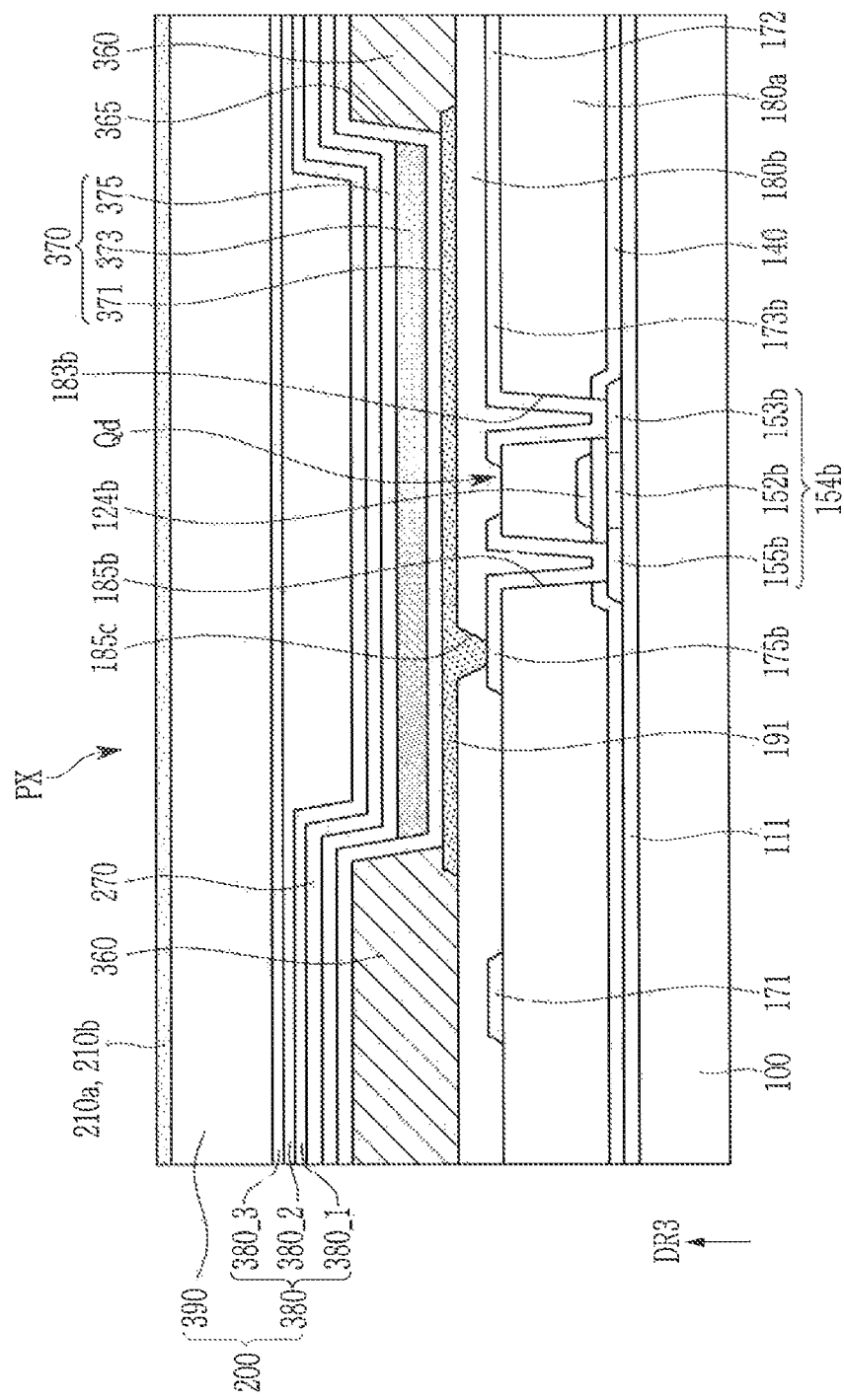

FIG. 15 and FIG. 16 are cross-sectional views of display devices according to exemplary embodiments of the present invention.

A display device according to an exemplary embodiment of the present invention may be a light emitting display device.

A barrier layer 111 that includes an insulation material may be disposed on a first substrate 100. The barrier layer 111 can prevent permeation of an external impurity into an upper portion of the display device through the first substrate 100. The barrier layer 111 may be omitted.

A semiconductor layer 154b that includes a channel region 152b, a source region 153b, and a drain region 155b may be disposed on the barrier layer 111. The source region 153b and the drain region 155b are disposed at opposite sides of the channel region 152b and are doped. The semiconductor layer 154b may include amorphous silicon, polysilicon, or a metal oxide.

A gate insulation layer 140 the may include an inorganic insulation material is disposed on the semiconductor layer 154b.

A gate conductive layer that includes a gate electrode 124b may be disposed on the gate insulation layer 140. The gate electrode 124b may overlap the channel region 152b.

An interlayer insulation layer 180a may be disposed on the gate conductive layer. The interlayer insulation layer 180a and the gate insulation layer 140 may include contact holes 183b and 185b that are respectively disposed on the source region 153b and the drain region 155b of the semiconductor layer 154b.

A plurality of data conductive layers that include a plurality of data lines 171, a plurality of input electrodes 173b, and a plurality of output electrodes 175b may be disposed on the interlayer insulation layer 180a. The input electrode 173b may be connected with the data line 171, and the output electrode 175b may be separated from the data line 171. The input electrode 173b and the output electrode 175b may be respectively electrically connected with the source region 153b and the drain region 155b of the semiconductor layer 154b through the contact holes 183b and 185b.

The gate electrode 124b, the channel region 152b, the source region 153b, and the drain region 155b may form a driving thin film transistor Qd.

A passivation layer 180b that includes an insulating material may be disposed on the data conductive layer. The passivation layer 180b may include a contact hole 185c disposed on the output electrode 175b.

A plurality of pixel electrodes 191 may be disposed on the passivation layer 180b. A pixel electrode 191 of each pixel PX may be electrically connected with the output electrode 175b through the contact hole 185c of the passivation layer 180b. The pixel electrode 191 may include a semi-transmissive conductive material or a reflective conductive material.

An insulation layer 360 including an opening 365 that is disposed on the pixel electrode 191 may be disposed on the passivation layer 180b.

A light emission member 370 may be disposed on the insulation layer 360 and the pixel electrode 191. The light emission member 370 may include a first common layer 371, an emission layer 373, and a second common layer 375, which are sequentially stacked from the bottom. The first common layer 371 may include, for example, a hole injection layer, a hole transport layer, and the like. The emission layer 373 may be disposed on a pixel electrode 191 of a corresponding pixel PX. The emission layer 373 may include an organic or inorganic material that uniquely emits light of primary colors such as red, green, and blue, and may have a structure in which a plurality of light emitting material layers, each emitting a different color, are stacked. The second common layer 375 may include, for example, an electron transport layer, an electron injection layer, and the like. At least one of the first and second common layers 371 and 375 can be omitted.

A common electrode 270 that transmits a common voltage may be disposed on the light emission member 370.

The pixel electrode 191, the light emission member 370, and the common electrode 270 may form a light emitting element, and one of the pixel electrode 191 and the common electrode 270 becomes a cathode and the other becomes an anode.

A second substrate 200 may be disposed on the common electrode 270. The second substrate 200 encapsulates the light emission member 370 and the common electrode 270 to prevent permeation of moisture and/or oxygen from the outside.

Constituent elements disposed between the first substrate 100 and the second substrate 200 may form the above-described pixel PX.

A touch conductive layer that includes a plurality of touch electrodes 210a and 210b and a plurality of touch signal lines may be disposed on the second substrate 200.

Next, referring to FIG. 16, a display device according to the present exemplary embodiment is similar to the above-described exemplary embodiment of FIG. 15, except for the second substrate 200.

The second substrate 200 according to the present exemplary embodiment may include a plurality of insulation layers 380_1, 380_2, 380_3, and 390. The plurality of insulation layers 380_1, 380_2, 380_3, and 390 may include at least two inorganic layers 380_1 and 380_3 and at least one organic layer 380_2 disposed between the at least two adjacent inorganic layers 380_1 and 380_3 that neighbor each other. The inorganic layers 380_1 and 380_3 include an inorganic material such as an aluminum oxide (AlOx), a silicon oxide (SiOx), a silicon nitride (SiNx), and the like, and the organic layer 380_2 includes an organic material and may have a substantially flat top surface.

The insulation layer 390 may include an organic material, and may have a substantially flat top surface. The insulation layer 390 can be omitted.

According to the several exemplary embodiments of the present disclosure, the flexible printed circuit film 400 does not need to contact the peripheral signal lines 101 and the touch peripheral signal lines 201 on the top surfaces 10a and 20a of each of the first substrate 100 and the second substrate 200 of each of the display panels 1000, 1000a, 1000b, 1000c, 1000d, and 1000e, and therefore, the area of the second bezel area PA2 and the second touch bezel area TPA2 can be more reduced. In addition, the touch portion and the display portion can be driven together using the driving circuit portion 500, which can be formed of one flexible printed circuit film 400 and one IC chip, and accordingly, which can further reduce manufacturing costs.

In the display panel of a display device according to another exemplary embodiment of the present invention, one of the first substrate 100 and the second substrate 200 can be omitted. In this case, the plurality of side wires 105 may be disposed on a side surface of an edge of one substrate, and features of the plurality of side wires 105 may be the same as the features of the plurality of side wires 105 of the above-described exemplary embodiments.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS 100, 200: substrate
101: peripheral signal line
105: side wire
201: touch peripheral signal line
300: connector
400: flexible printed circuit film
500: driving circuit portion

What is claimed is:
1. A display device comprising:
a first substrate and a second substrate;
a plurality of signal lines that are formed on the first substrate or on the second substrate; and
a plurality of side wires that are disposed on a side surface of a first edge of the first substrate and a side surface of a second edge of the second substrate,
wherein the plurality of side wires are disposed apart from each other along an extension direction of the first edge and the second edge, and are connected with the plurality of signal lines, and
the side surface of the first edge of the first substrate and the side surface of the second edge of the second substrate form a concave surface having a normal plane of maximum curvature that is parallel to the first substrate.
2. The display device of claim 1, wherein thickness of at least two side wires among the plurality of side wires are different from each other.
3. A display device comprising:
a first substrate and a second substrate;

a plurality of signal lines that are formed on the first substrate or on the second substrate; and a plurality of side wires that are disposed on a side surface of a first edge of the first substrate and a side surface of a second edge of the second substrate, wherein the plurality of side wires are disposed apart from each other along a first direction of the first edge and the second edge, and are connected with the plurality of signal lines, and the side surface of the first edge of the first substrate and the side surface of the second edge of the second substrate form a concave surface having a concavity in a second direction that is parallel to the first substrate and perpendicular to the first direction.

* * * * *